United States Patent

Aldefeld et al.

[11] Patent Number: 5,929,638
[45] Date of Patent: Jul. 27, 1999

[54] MR METHOD AND DEVICE FOR CARRYING OUT THE METHOD

[75] Inventors: Bernd Aldefeld; Peter Börnert, both of Hamburg, Germany

[73] Assignee: U.S. Philips Corporation, New York, N.Y.

[21] Appl. No.: 08/896,759

[22] Filed: Jul. 18, 1997

[30] Foreign Application Priority Data

Aug. 7, 1996 [DE] Germany .................. 196 31 845

[51] Int. Cl.⁶ ........................................... G01V 3/00
[52] U.S. Cl. .................................. 324/307; 324/309
[58] Field of Search .......................... 324/300, 307, 324/309, 312, 318, 322

[56] References Cited

U.S. PATENT DOCUMENTS 4,585,995  4/1986  Flugan .............................. 324/318
4,698,591  10/1987  Glover et al. ..................... 324/307

OTHER PUBLICATIONS

"A New Nyquist Ghost in Oblique Echo Planar Images" X. Zhou et al, ISMRM 1996, pp. 386, 1477 and 1481.

Primary Examiner—Louis Arana
Attorney, Agent, or Firm—Dwight R. Renfrew; Jack D. Slobod

[57] ABSTRACT

In an MR method whereby artefacts can be eliminated in MR images of inclined slices which are situated outside the isocenter, the temporal variation of a phase error is calculated from the imposed (desired) variation of the magnetic gradient fields and the impulse responses of the gradient coil sub-systems generating these fields, and the measured MR signals are corrected accordingly.

9 Claims, 3 Drawing Sheets

MR METHOD AND DEVICE FOR CARRYING OUT THE METHOD

BACKGROUND OF THE INVENTION

1. Field of the Invention

The invention relates to an MR method which involves at least one sequence in which the nuclear magnetization in a slice of an examination zone is excited in the presence of a uniform, steady magnetic field, after which at least one first magnetic gradient field is generated which has a gradient extending in a first direction which is tangential to the slice, and possibly also a second magnetic gradient field with a gradient extending in a second direction which is also tangential to the slice, an MR signal (S(t)) being received from the examination zone and the gradient fields of at least two gradient coil systems being combined in order to generate the first and the second gradient field.

2. Description of Related Art

MR methods of this kind are known from publications by Zhou et al. and also from Gatehouse et al. in ISMRM Abstracts, page 386, 1477 or 1481 (1996). These publications describe an EPI method in which the phase encoding gradient and the read gradient both extend obliquely relative to the x direction and the y direction, respectively so that the gradient fields of the gradient coil systems for the x direction and the y direction must be combined in order to generate these gradients. From the cited publications it is also known that the phase encoding gradient in such an EPI sequence can be influenced by the read gradient, so that so-called ghost images may occur if such influencing is not corrected. Such influencing occurs only if the temporal behavior of the channels with the individual gradient coil systems differs.

SUMMARY OF THE INVENTION

Research that has resulted in the invention has demonstrated that the proposed correction steps have a limited effect only. During the examination of slices where neither the slice normal nor the first or second gradient direction coincides with one of the directions in which the gradient of a gradient field generated by a respective one of the gradient coil sub-systems is situated, the ghost images can still occur because the phase of the MR signal is influenced by the gradient fields. These phase errors may give rise to disturbing image artefacts in the case of phase-sensitive MR imaging methods such as the EPI method.

It is an object of the present invention to conceive a method of the kind set forth in such a manner that said phase errors can be corrected. This object is achieved according to the invention in that the temporal variation of a phase error contained in the MR signal is calculated from the imposed temporal variation of the first and/or the second magnetic gradient field as well as from the impulse responses of the gradient coil sub-systems, and that the MR signal is corrected accordingly. The invention is based on the following considerations.

In the case of combination of the gradient fields of two (or three) gradient coil sub-systems whose temporal behavior is not identical, for example due to eddy current effects, instead of the desired or imposed (first or second) magnetic gradient field, a gradient field whose direction and possibly its strength deviate from the imposed gradient field will be generated during a transitional phase. This temporary deviation of the actual gradient field from the desired gradient field can be considered to be an error gradient field which can be decomposed into a component which is tangential to the slice and a component which is normal (perpendicular) to the slice.

The effects of the component tangential to the slice and their correction has been described in the cited documents (in relation to an EPI sequence). The invention concerns the component normal to the slice and the correction of its effects.

The temporarily active gradient normal to the slice causes phase errors in the MR signal if the slice being examined is situated outside the isocenter of the MR system (the isocenter is the point in space in which the magnetic gradient fields generated by the gradient coil systems have the value zero). These phase errors can cause artefacts in the MR image (for example, ghost images in the case of EPI sequences) if the MR method (including the reconstruction of the MR image from the MR signals) is phase sensitive. The invention avoids these artefacts in that the phase errors in the MR signal are corrected. For the correction of the phase error, the temporal variation thereof is calculated from the predetermined temporal variation of the first and/or the second magnetic gradient field as well as from the impulse responses of the gradient coil sub-systems.

The invention can in principle be used for all MR methods in which the phase information contained in the MR signal is required for the reconstruction of an MR image. Thus, in a further version of the invention the first gradient is a read gradient having an alternating polarity and the second gradient is a phase encoding gradient which is active exclusively upon the transitions from one polarity of the read gradient to the other, the MR signals occurring after the polarity reversal being acquired and used, after correction of their phase position, for the formation of an MR image. This is the so-called EPI method in which the phase error causes ghost images which are avoided by the invention.

In a further version of the invention the gradient fields of at least two gradient coil systems are combined in such a time-dependent manner that the superposition of their gradients yields a rotating read gradient whose amplitude increases or decreases as a function of time. In this version the k space is scanned along a spiral, the advantages of the invention being particularly significant if the spirals are tracked at a non-uniform angular velocity.

In a further version of the invention a plurality of sequences act on the examination zone and the gradient fields of at least two gradient coil sub-systems are combined and varied from one sequence to another in such a manner that the direction of the read gradient resulting therefrom varies from one sequence to another whereas its absolute value remains constant, and that the MR signals occurring in conjunction with this read gradient are acquired and used, after correction of their phase position, for the formation of an MR image. This MR method is known as the projection-reconstruction method and also enables the formation of "absolute" images, where the phase information contained in the MR signal has no relevance, but also enables a phase-sensitive reconstruction for which the invention can be attractively used.

An MR apparatus for carrying out the method includes a) a main field magnet for generating a uniform, steady magnetic field,
b) a gradient coil system including a plurality of gradient coil sub-systems for generating respective magnetic gradient fields having gradients extending in different directions,
c) an RF coil system for exciting the nuclear magnetization in a slice of an examination zone by means of at least one RF pulse, d) a receiver for acquiring the MR signals generated in the examination zone, e) a reconstruction unit for reconstructing the nuclear magnetization distribution in the examination zone from the corrected MR measuring data, and f) a control unit for controlling the gradient coil system, the RF coil system and the receiver, and characterized in that the control unit is programmed so that at least two of the gradient coil sub-systems simultaneously generate a magnetic gradient field with a temporal variation which is imposed by the control unit, and that there are provided means for calculating the temporal variation of a phase error contained in the MR signal, which means calculate the phase error ($\phi$) from the imposed temporal variation of the magnetic gradient field as well as from the impulse responses of the gradient coil sub-systems and correct the MR signal accordingly.

BRIEF DESCRIPTION OF THE DRAWINGS

The invention will be described in detail hereinafter with reference to drawings. Therein.

DETAILED DESCRIPTION OF THE PREFERRED EMBODIMENTS

Figure 1:
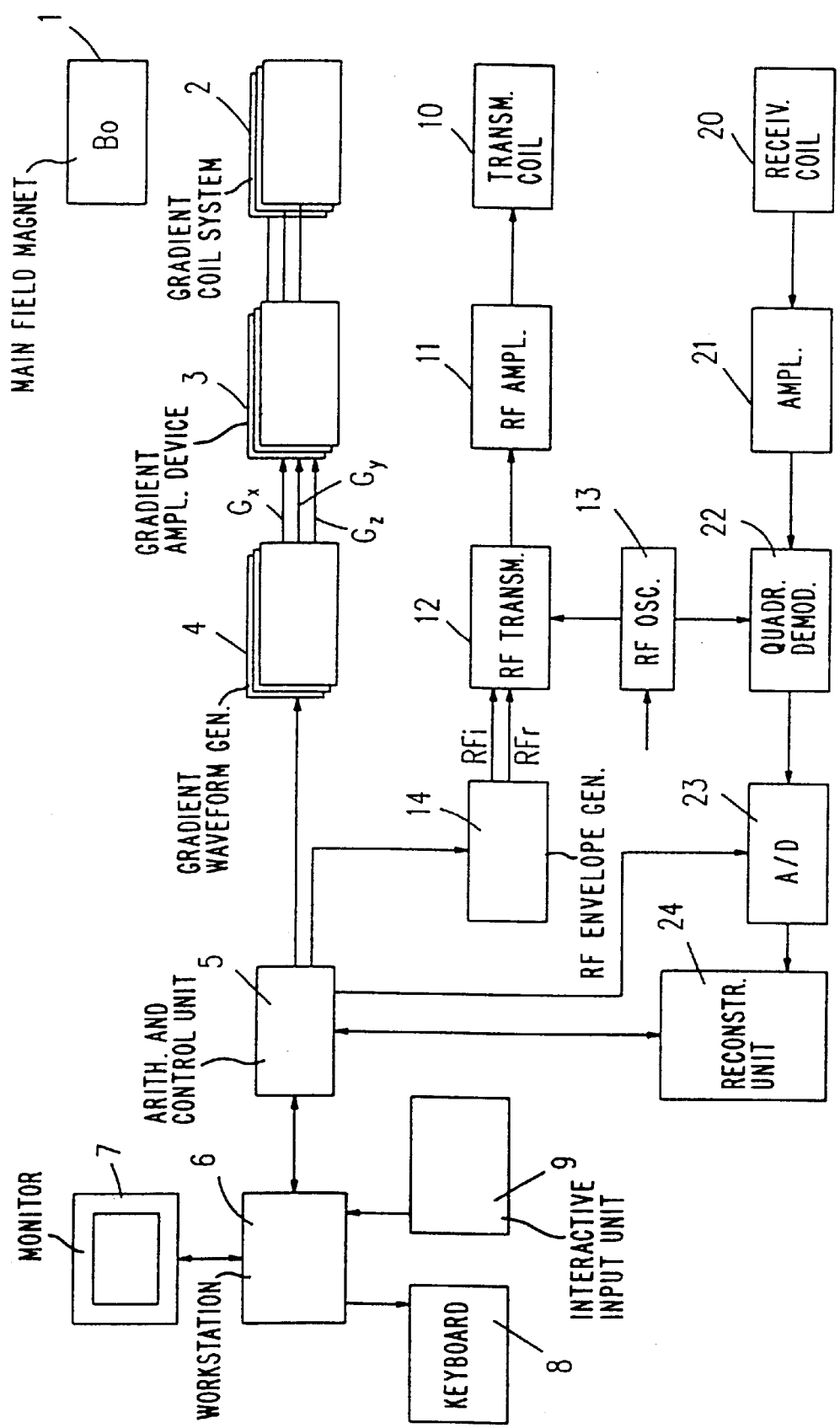
FIG. 1 shows the block diagram of an MR apparatus suitable for carrying out the invention.

FIG. 1 shows diagrammatically a main field magnet 1 which generates a steady, essentially uniform magnetic field of a strength of, for example 1.5 tesla in the z direction in an examination zone (not shown). The z direction is oriented horizontally and in the longitudinal direction of an examination table (not shown) on which a patient is accommodated during an MR examination.

Also provided is a gradient coil system 2 which includes three gradient coil sub-systems capable of generating magnetic gradient fields $G_x$, $G_y$ and $G_z$ which extend in the z direction and have a gradient in the x, the y, and the z direction, respectively. If this gradient coil system is to be used to generate gradient fields having a gradient which does not coincide with the x, the y, or the z direction, two or three of the gradient coil sub-systems must be simultaneously active. The temporal variation of the magnetic gradient fields is imposed by a waveform generator, that is to say separately for each of the x, the y and the z directions. The waveform generator 4 is controlled by an arithmetic and control unit 5 which calculates, after the examination method (for example, an EPI sequence) and its geometrical parameters (for example, position of the slice to be imaged) have been entered, the necessary temporal variation of the magnetic gradient fields $G_x$, $G_y$, $G_z$ so as to load it into waveform generator. During an MR examination, these signals are read from the waveform generator and applied to a gradient amplifier device 3 which generates the currents required for the gradient coil system 2 on the basis thereof.

The control unit 5 also cooperates with a workstation 6. The workstation includes a monitor 7 for the display of MR images. Entries can be made via a keyboard 8 or an interactive input unit 9, for example a light pen; such entries are, for example the MR method to be used during an MR examination, the position of the slices to be imaged, etc.

The nuclear magnetization in the examination zone can be excited by RF pulses from an RF transmitting coil 10 which is connected to an RF amplifier 11 which amplifies the output signals of an RF transmitter 12. The RF transmitter 12 modulates the (complex) envelopes of the RF pulses with carrier oscillations which are supplied by an oscillator 13 and whose frequency corresponds to the Larmor frequency (approximately 63 MHz in the case of a main magnetic field of 1.5 tesla). The arithmetic and control unit 5 loads the (complex) envelope into a generator 14 which is coupled to the transmitter 12.

The MR signals generated in the examination zone are picked up by an RF receiving coil 20 and amplified by an amplifier 21. The amplified MR signal is demodulated in a quadrature demodulator 22 by two 90° offset carrier oscillations of the oscillator, resulting in two signals which may be considered as the real part and the imaginary part of a complex MR signal. These signals are applied to an analog-to-digital converter 23 which forms MR data therefrom, provided that it is not inhibited by the control unit 5. The MR data is stored and corrected in a reconstruction unit 24 which cooperates with the workstation 6 so as to reconstruct MR images, representing the nuclear magnetization in the examination zone, from the MR data derived from a plurality of MR signals.

Figure 2:
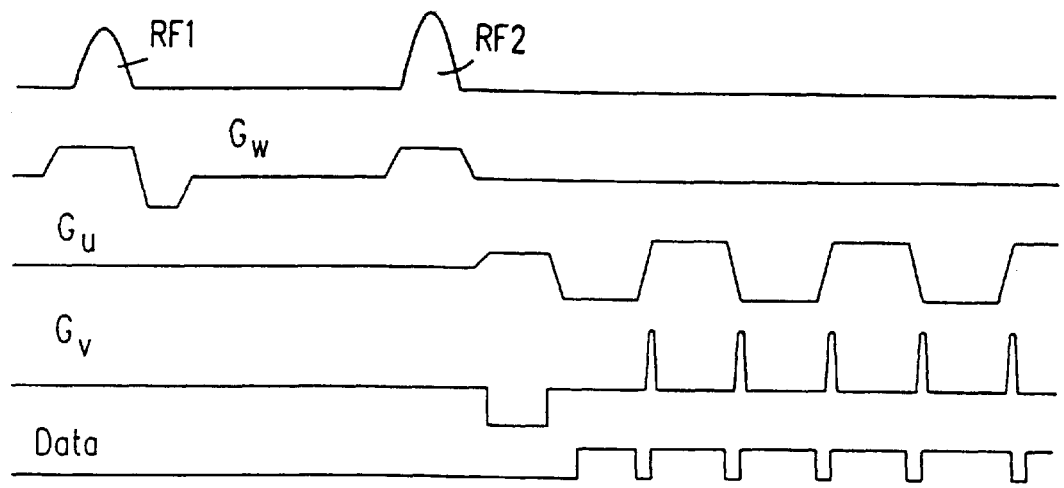
FIG. 2 shows the temporal variation of various signals in a sequence for which the invention can be advantageously used.

FIG. 2 shows an MR sequence of the EPI type for which the invention can be attractively used. The sequence comprises two RF excitation pulses RF1 and RF2 (first line) which, in conjunction with a magnetic gradient field $G_w$ (second line) extending in the w direction, rotate the nuclear magnetization in a slice perpendicular to the w direction 90° and 180°, respectively, out of its steady state. Subsequently, an alternating read gradient $G_u$ which extends in the u direction is applied (third line) as well as a phase encoding gradient $G_v$ (fourth line) which extends in the v direction and is activated exclusively during the polarity reversal of the read gradient $G_u$ to produce blips. Whenever the read gradient $G_u$ has a positive or a negative polarity, an MR signal is acquired (fifth line); thus, the arithmetic and control unit 5 enables the analog-to-digital converter 23 so that the MR signals received can be converted into MR data.

Figures 4A, 4B:
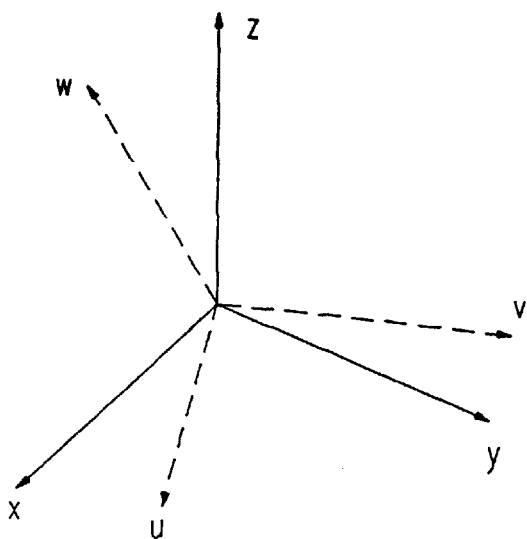
FIG. 4a shows the directions u, v, w of the magnetic gradient fields in relation to an x, y, z coordinate system.
FIG. 4b shows a transformation matrix for conversion of the two coordinate systems into one another.

FIG. 4 shows the three mutually perpendicular directions u, v, w in the x, y, z coordinate system. The direction u of the read gradient and the direction v of the phase encoding gradient enclose an angle other than 90° with respect to the z direction as well as with respect to the w direction in which the normal to the slice excited by the pulses RF1 and RF2 extends. This means that the coil sub-systems for the x direction, the y direction and the z direction in the gradient coil system 2 must be simultaneously active in order to generate one of the gradient fields $G_u$, $G_v$, $G_w$. The transformation matrix of FIG. 4b shows the ratios of the contributions then required.

This transformation matrix on the one hand shows the components constituting the gradients $G_u$, $G_v$ and $G_w$. According to this matrix, for example a magnetic gradient field $G_u$ is obtained with a given gradient strength if the magnetic gradient fields $G_x$, $G_y$ and $G_z$ are active with a fraction $a_1$, $b_1$ and $c_1$, respectively, of this gradient strength. The transformation matrix also shows how large the gradient fields $G_u$, $G_v$ or $G_w$ are if only one of the gradient fields $G_x$, $G_y$ or $G_z$ is active (for example, components of the magnetic gradient field occur in the u direction, the v direction and the w direction with the relative magnitude $c_1$, $c_2$, $c_3$ if a magnetic gradient field of magnitude 1 is activated in the z direction). The elements $a_1$, $a_2$ and $a_3$ are then defined by the respective cosine of the angle enclosed by the axes u, v, w relative to the axis x; similarly, the elements $b_1$, $b_2$, $b_3$ represent the directional cosinuses of the direction of u, v, w relative to the y axis, and $c_1$, $c_2$, $c_3$ represent the relevant directional cosine between u, v, w on the one side and z on the other side. As is known, the sum of the squares of the three elements contained in one row or column of the transformation matrix amounts to 1.

Figure 3A:
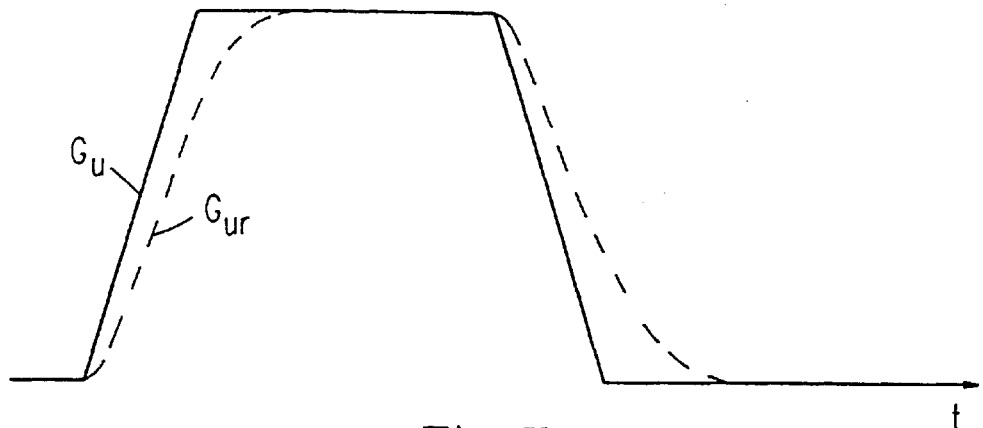
FIGS. 3a to 3c show the temporal variation of further signals in such a sequence at an enlarged scale.

The temporal variations of $G_w$, $G_u$, $G_v$ as shown on the lines 2 to 4 in FIG. 2 represent the temporal variation of these quantities as imposed via the control unit 5 or the waveform generator 4. The actual variation of the magnetic gradient fields deviates therefrom because of the frequency response of the components 3, 2 (see FIG. 1). This effect and its consequences will be described in detail hereinafter with reference to the FIGS. 3a, 3b and 3c. The solid lines in FIG. 3a denote the temporal variation of $G_u$, i.e. the variation of the magnetic gradient field in the u direction as desired or preset (by the control unit 5 or the waveform generator 4). Dashed lines in FIG. 3a represent the actual variation $G_{ur}$ of the magnetic gradient field which occurs because the various gradient sub-systems cannot follow the imposed temporal variation without delay. Problems may then occur if different delays occur in the individual channels for the x direction, the y direction and the z direction.

As appears from the transformation matrix of FIG. 4b, a magnetic gradient field having a gradient extending in the u direction can be generated only if the strengths of the magnetic gradient fields $G_x$, $G_y$ and $G_z$ relate as the elements $a_1$, $b_1$, $c_1$ of the transformation matrix. This condition is not satisfied for as long as the magnetic gradient fields $G_x$, $G_y$ and $G_z$ generated by the gradient coil system 2 have not reached the value imposed by the waveform generator 4 and approach this value with different temporal behavior. During these time intervals, therefore, there are also components of the magnetic gradient field which have a gradient in the v direction or the w direction. This means, for example that even though no magnetic gradient field is imposed in the w direction at the relevant instant, the magnetic gradient $G_u$ is accompanied by such a gradient $G_w$ which extends perpendicularly to the selected slice.

It can be demonstrated that the temporal variation of this magnetic gradient field $G_w(t)$ is subject to the following relation:

$$G_w(t)=c_3(c_1 G_u(t)+c_2 G_v(t))*(I_z-I_x)+b_3(b_1 G_u(t)+b_2 G_v(t))*(I_y-I_x) \quad (1)$$

Therein, $c_1 \ldots c_3$ and $b_1 \ldots b_3$ are the elements of the transformation matrix of FIG. 4b, whereas $G_u(t)$ and $G_v(t)$ represent the imposed (desired) temporal variation of the magnetic gradient field in the u direction and the v direction, respectively. The operator * symbolizes a convolution. $I_x$, $I_y$ and $I_z$ are the pulse responses of the channels for the x direction, the y direction and the z direction in the units 2 and 3.

The impulse response is imposed by the construction of the gradient coil system 2 and the amplifier system 3. It represents the temporal variation of the magnetic gradient field when a so-called Dirac impulse is given on the input, i.e. a signal which abruptly increases to a high value and immediately disappears again. Such a Dirac impulse cannot be generated in practice, because it should have an infinite amplitude and a duration zero. The impulse response can be determined nevertheless by measuring the temporal variation of a suitable excitation variable on the input (input variable) of one of the gradient amplifiers 3 and the temporal variation of the magnetic gradient field (output variable) subsequently generated by the gradient coil 2 connected to the gradient amplifier. Assuming that the system consisting of the gradient amplifier 3 and the gradient coil 2 is linear (which condition is satisfied in practice), use can be made of the fact that the output variable of a linear system is given by the convolution of the input variable with the impulse response. The impulse response can be calculated therefrom, for example by "deconvolution" which cancels the convolution operation. The impulse responses $I_x$, $I_y$ and $I_z$ thus determined for the channels 2, 3 for the x direction, the y direction and the z direction are stored.

It appears from the equation (1) that upon application of the gradients $G_u(t)$ and $G_v(t)$, extending in the slice plane, the gradient $G_w(t)$, extending perpendicularly to the slice, would not occur if the three channels for the x direction, the y direction and the z direction were to have identical impulse responses $I_x$, $I_y$, $I_z$. This condition is usually not satisfied. Even though usually an identical temporal variation occurs for the x direction and the y direction (so that the second of the two summands in the equation (1) disappears), the temporal behavior of the gradient sub-systems 2, 3 for the x direction and the y direction deviates from the temporal behavior for the z direction. The equation (1) also reveals that in the latter case the gradient field extending perpendicularly to the slice plane does not occur either if $c_3$ equals zero, i.e. if the slice normal w extends perpendicularly to the z direction.

Figure 3B:

FIG. 3b shows the temporal variation of the magnetic gradient field $G_w(t)$ caused by the gradient $G_u$ in conformity with FIG. 3a. It appears that the disturbing gradient $G_x(t)$ occurs simultaneously with the actual gradient in the u direction, $G_{ur}$, that is to say for as long as the latter deviates from the imposed temporal variation $G_u$.

The occurrence of the disturbing component $G_w(t)$ means that the so-called k space is not scanned along a u, v plane, but along a non-flat plane. For the component $k_w(t)$ in the k space then holds that $$k_w(t)=\gamma \int G_w(t)dt \quad (2)$$

Therein, $\gamma$ is the gyromagnetic constant (approximately 42.5 MHz/T). If the excited slice does not extend through the isocenter of the gradient coil system, a phase shift $\phi(t)$ occurs in conformity with the equation $$\phi(t)=k_w(t)L \quad (3)$$

where L is the distance between the excited slice and the isocenter.

Thus, this means that an MR signal S(t) appears in the excited oblique slice which is situated at a distance from the isocenter, which MR signal S(t) is subject to the relation:

$$S(t)=S_o(t)e^{-j\phi(t)} \quad (4)$$

Figure 3C:

Therein, $S_0(t)$ is the MR signal which would occur if no phase shift were caused by the disturbing gradient field $G_w(t)$. FIG. 3c shows the temporal variation of the phase error $\phi$ resulting from the equations (2) and (3). During the rise of $G_{ur}$ the phase error $\phi$ increases to a constant value, and decreases to the value zero again as $G_{ur}$ decreases.

In principle the same holds for $G_v$ as for $G_u$. However, because the leading and trailing edge of these blips directly succeed one another, the phase error has disappeared already upon acquisition of the MR signal (fifth line of FIG. 2). Therefore, the component based on $G_v$ can be ignored in the case of an EPI sequence.

Figure 5:
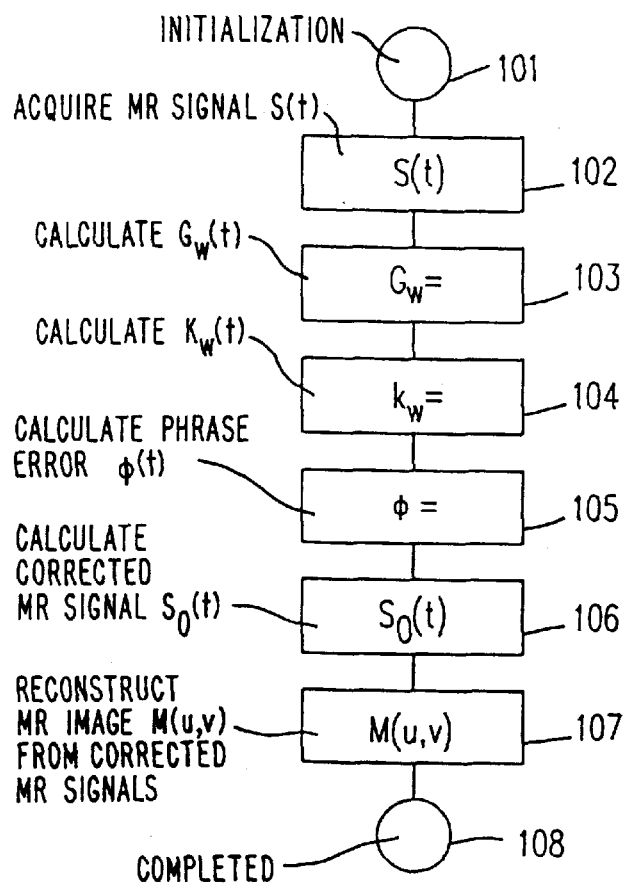
FIG. 5 shows a flow chart illustrating the signal processing according to the invention.

The above considerations result in the flow chart for the correction of the phase error contained in the MR data S(t) received as will be described with reference to FIG. 5. Block 101 comprises the initialization and inter alia the generation of the RF pulses RF1 and RF2. Subsequently, a respective MR signal is acquired at the positive as well as the negative polarity of the read gradient $G_u$, which signal is converted into a series of MR data (block 102). The temporal variation of the magnetic gradient field $G_w(t)$ extending perpendicularly to the slice plane is calculated in conformity with the equation (1) in block 103. From the value thus calculated, the value $k_w(t)$ resulting therefrom is calculated in block 104 in conformity with the equation (2), which value can be used to calculate the value for the phase error $\phi$ in conformity with the equation (3) in block 105. In block 106 the measured temporal variation of the signal S(t) is corrected in conformity with the calculated temporal variation by adding the calculated phase error and the signal phase resulting from the temporal variation of the measured MR signal S(t). In conformity with the equation (4), this results in the MR signal $S_0(t)$ wherefrom the phase error has been removed.

The calculation steps 103 and 105 are based on values $(a_1 \ldots c_3; G_u(t) \ldots; I_x \ldots I_z)$ which are known already at the beginning of the MR examination. This calculation, therefore, can be performed already before the acquisition of the MR signal (block 102), so that the MR signal can be corrected immediately after having been measured.

In block 107 the nuclear magnetization distribution M(u, v) within the excited slice is reconstructed from the corrected MR signals $S_0(t)$. The fact must be taken into account that the same effect which causes the disturbing gradient $G_w(t)$ in temporal association with the read gradient $G_u(t)$ also generates an undesirable magnetic gradient field which extends in the v direction and falsifies the phase encoding. This falsification can be taken into account by enlarging or reducing the blips of the gradient $G_v$ accordingly, as described in the cited publications, or by using a reconstruction method which does not assume a uniform distribution of the MR data in the k space, for example the known gridding method. The execution of the method is completed in block 108.

The invention has been described with reference to an EPI sequence. However, the invention can also be used for other MR methods in which the image information is derived from the MR data in a phase-sensitive manner. The artefacts (ghost images, unsharpness etc.) introduced by the undesirable gradient $G_w(t)$ are then dependent on the relevant MR method.

We claim:

1. An MR method comprising exciting nuclear magnetization in a slice of an examination zone in the presence of a uniform, steady magnetic field, generating at least one of a first magnetic gradient field with a gradient extending in a first direction which is tangential to the slice and of a second magnetic gradient field with a gradient extending in a second direction which is also tangential to the slice, wherein the generating comprises combining gradient fields of at least two gradient coil sub-systems, which generate gradients extending in different direction, receiving an MR signal from the examination zone, calculating a phase error contained in the MR signal from an imposed temporal variation of at least one magnetic gradient field as well as from impulse responses of said at least two gradient coil sub-systems, and correcting the phase position of the received MR signal based on the calculated temporal variation of the phase error.

2. An MR method as claimed in claim 1, wherein the first magnetic gradient field is a read gradient having an alternating polarity and the second magnetic gradient field is a phase encoding gradient which is active exclusively upon transitions from one polarity of the read gradient to the other, the MR signals occurring after the polarity reversal being received and used, after correction of their phase positions, for the formation of an MR image.

3. An MR method as claimed in claim 1, wherein the gradient fields of said at least two gradient coil sub-systems are combined in such a time-dependent manner that a superposition of their gradients yields a rotating read gradient whose amplitude increases or decreases as a function of time.

4. An MR method as claimed in claim 1, wherein a plurality of sequences act on the examination zone and the gradient fields of said at least two gradient coil sub-systems are combined and varied from one sequence to another in such a manner that the direction of the read gradient resulting therefrom varies from one sequence to another whereas its absolute value remains constant, and that the MR signals occurring in conjunction with this read gradient are received and used, after correction of their phase positions, for the formation of an MR image.

5. The method of claim 1 wherein said calculating the phase error comprises calculating an error gradient field which is generated perpendicular to the slice.

6. The method of claim 1 further comprising reconstructing an MR image from corrected MR signals.

7. The method of claim 1 wherein the slice does not coincide with either of the directions of the gradient fields generated by the at least two gradient coil sub-systems.

8. An MR apparatus comprising:

a main field magnet for generating a uniform, steady magnetic field in an examination zone, a gradient coil system including a plurality of gradient coil sub-systems for generating respective magnetic gradient fields having gradients extending in different directions in the examination zone, an RF coil system for exciting the nuclear magnetization in a slice of the examination zone by means of at least one RF pulse, a receiver for acquiring the MR signals generated in the examination zone, control means for controlling the gradient coil system, the RF coil system, and the receiver, so that at least two of the gradient coil sub-systems simultaneously generate a magnetic gradient field with an imposed temporal variation means for correcting the phase position of received MR signals by calculating a temporal variation of a phase error contained in the MR signal from the imposed temporal variation of the magnetic gradient fields and the impulse responses of said at least two gradient coil sub-systems and uses the calculated temporal variations of the phase error to derive the corrected MR measuring data from the acquired MR signals], and a reconstruction unit for reconstructing the nuclear magnetization distribution in the examination zone from the corrected MR signals.

9. The apparatus of claim 8 wherein said means for correcting further comprises means for calculating an error gradient field which is generated perpendicular to the slice.

* * * * *